(12) United States Patent
Martin et al.

(10) Patent No.: US 8,941,000 B2
(45) Date of Patent: Jan. 27, 2015

(54) SOLAR CONCENTRATOR COOLING BY VORTEX GAS CIRCULATION

(75) Inventors: Yves C. Martin, Ossing, NY (US); Robert L. Sandstrom, Chestnut Ridge, NY (US); Theodore G. Van Kessel, Millbrook, NY (US); Hussam Khonkar, Riyadh (SA)

(73) Assignees: International Business Machines Corporation, Armonk, NY (US); King Abdulaziz City for Science and Tehnology, Riyadh (SA)

( * ) Notice: Subject to any disclaimer, the term of this patent is extended or adjusted under 35 U.S.C. 154(b) by 0 days.

(21) Appl. No.: 13/365,306

(22) Filed: Feb. 3, 2012

(65) Prior Publication Data

US 2013/0199595 A1   Aug. 8, 2013

(51) Int. Cl.
*H01L 31/052* (2014.01)

(52) U.S. Cl.
CPC .......... *H01L 31/052* (2013.01); *H01L 31/0521* (2013.01); *H01L 31/0524* (2013.01); *Y02E 10/52* (2013.01); *H01L 31/0522* (2013.01)
USPC ............................. 136/246; 136/251; 136/259

(58) Field of Classification Search
USPC ........................... 136/246, 248, 251; 126/637
See application file for complete search history.

(56) References Cited

U.S. PATENT DOCUMENTS

| | | | |
|---|---|---|---|
| 4,691,075 A | 9/1987 | Murphy | |
| 6,073,500 A | 6/2000 | Jorgensen et al. | |
| 6,272,867 B1 * | 8/2001 | Barrash et al. | 62/6 |
| 6,827,082 B1 | 12/2004 | Kogan et al. | |
| 7,086,823 B2 | 8/2006 | Michaud | |
| 7,665,955 B2 | 2/2010 | Liang | |
| 2002/0074034 A1 | 6/2002 | Fujisaki et al. | |
| 2003/0217766 A1 | 11/2003 | Schroeder et al. | |
| 2005/0016581 A1 * | 1/2005 | Fujisaki et al. | 136/246 |
| 2005/0081909 A1 | 4/2005 | Paull | |
| 2007/0070531 A1 * | 3/2007 | Lu | 359/851 |
| 2007/0132353 A1 | 6/2007 | Gijzen et al. | |

(Continued)

FOREIGN PATENT DOCUMENTS

WO   WO 00/42320 A1   7/2000
WO       0070641 A1   11/2000

OTHER PUBLICATIONS

Martinelli, G. et al., "Solar Cell Cooling" Springer Series in Optical Sciences (2007) pp. 133-149, vol. 130.

(Continued)

*Primary Examiner* — Jeffrey T Barton
*Assistant Examiner* — Meisha Binkley
(74) *Attorney, Agent, or Firm* — Scully, Scott, Murphy & Presser, P.C.; Vazken Alexanian

(57) ABSTRACT

A convective method is employed to cool a solar concentrator device. The convective method employs formation of a vortex gas circulation inside an enclosure of the solar concentrator device, which is bounded by at least one light-path altering component, sidewalls, and a back panel. Optionally, a heat sink assembly can be provided within the enclosure. Internal convention through the vortex gas circulation transfers the heat generated at a photovoltaic cell to all surfaces of the solar concentrator device to facilitate radiative and/or convective cooling at the outside surfaces of the enclosure.

23 Claims, 9 Drawing Sheets

(56) References Cited

U.S. PATENT DOCUMENTS

| | | | |
|---|---|---|---|
| 2010/0186820 A1 | 7/2010 | Schon | |
| 2010/0263709 A1* | 10/2010 | Norman et al. | 136/246 |
| 2011/0030764 A1 | 2/2011 | Seo et al. | |
| 2011/0126885 A1 | 6/2011 | Kokotov et al. | |
| 2007/0272295 A1 | 11/2007 | Rubin et al. | |
| 2007/0295384 A1 | 12/2007 | Uozumi et al. | |
| 2008/0240913 A1* | 10/2008 | Tsu et al. | 415/208.1 |

OTHER PUBLICATIONS

Zakzouk, A.K.M. et al., "Performance Evaluation of Photovoltaic Silicon Cells Under Concentrated Sunlight" Solid-State and Electron Devices, IEE Proceedings (Apr. 1984) pp. 66-72, vol. 131, Pt. 1, No. 2.

International Appln. No. PCT/US2013/020449, International Search Report and Written Opinion dated Mar. 4, 2013.

* cited by examiner

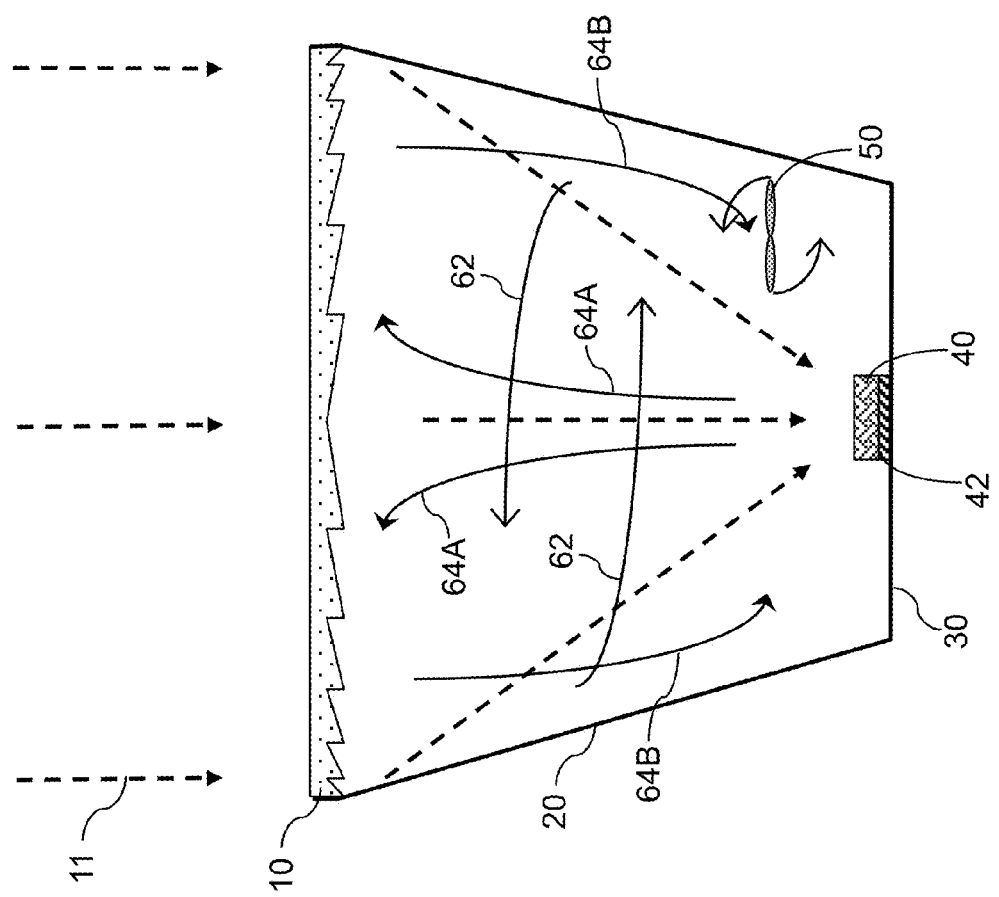

SOLAR CONCENTRATOR COOLING BY VORTEX GAS CIRCULATION

BACKGROUND

The present disclosure relates to a solar concentrator device, and more particularly to a solar concentrator device including a fan for providing a vortex gas circulation within an enclosure, and methods of operating the same.

Solar concentrators operating at extreme concentrations require optimal cooling systems to dissipate the power (waste heat) that is delivered to the cell and not converted to electrical power. In low concentration systems, the density of power that needs to be dissipated can be about 30 W/cm$^2$. At this power level, cooling is possible with compact passive elements. High concentration systems operating at 1000 suns and above must dissipate about 100 W/cm$^2$ or more. At these power levels, cooling systems known in the art employ high performance components and a considerable cooling fin area to efficiently couple to the environment in a passive convection system.

BRIEF SUMMARY

A convective method is employed to cool a solar concentrator device. The convective method employs formation of a vortex gas circulation inside an enclosure of the solar concentrator device, which is bounded by at least one light-path altering component, sidewalls, and a back panel. Optionally, a heat sink assembly can be provided within the enclosure. Internal convention through the vortex gas circulation transfers the heat generated at a photovoltaic cell to all surfaces of the solar concentrator device to facilitate radiative and/or convective cooling at the outside surfaces of the enclosure.

According to an aspect of the present disclosure, a solar concentrator device includes: an enclosure including at least one light-path altering component located at a front side, a back panel located at a back side, and at least one side panel extending from the at least one light-path altering component to the back panel; at least one photovoltaic cell located within the enclosure and on the back panel; and a fan located within the enclosure.

According to another aspect of the present disclosure, a method of operating a solar concentrator device is provided, which includes: providing a solar concentrator device including: an enclosure including at least one light-path altering component located at a front side, a back panel located at a back side, and at least one side panel extending from the at least one light-path altering component to the back panel, at least one photovoltaic cell located within the enclosure and on the back panel, and a fan located within the enclosure; and generating a vortex gas circulation within the enclosure by running the fan while the at least one photovoltaic cell generates electricity.

BRIEF DESCRIPTION OF SEVERAL VIEWS OF THE DRAWINGS

FIG. 2 is a vertical cross-sectional view of a second exemplary solar concentrator device according to an embodiment of the present disclosure.

DETAILED DESCRIPTION

Figure 1A:
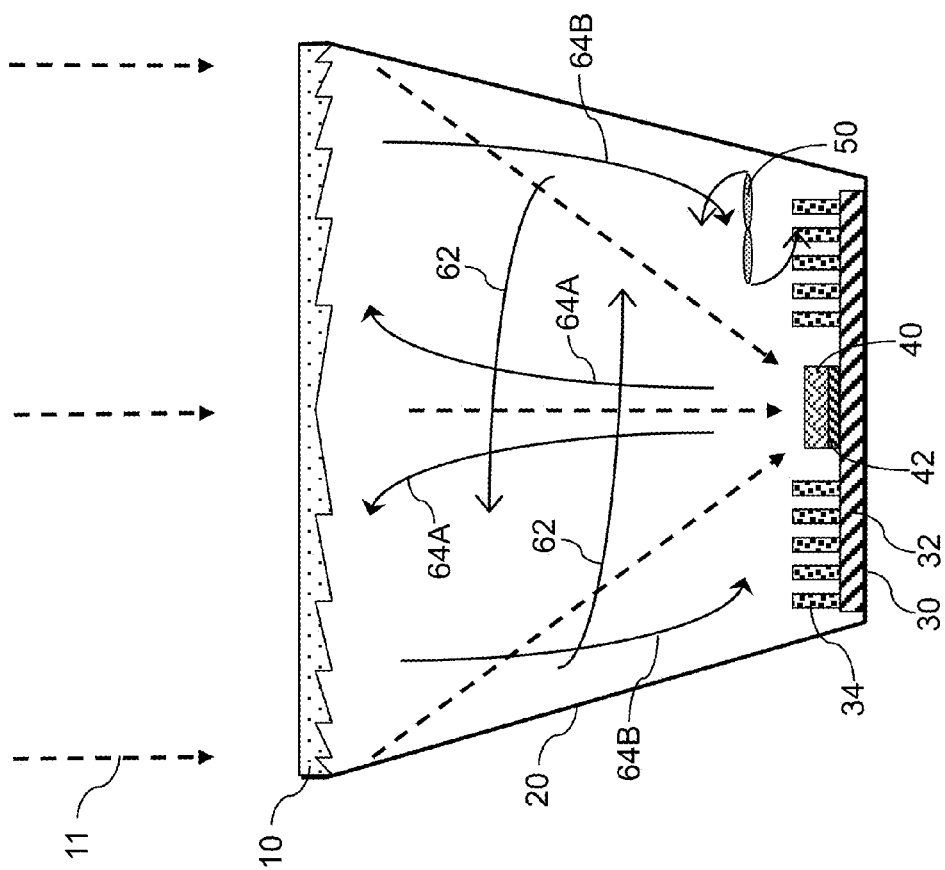
FIG. 1A is a vertical cross-sectional view of a first exemplary solar concentrator device according to an embodiment of the present disclosure.

As stated above, the present disclosure relates to a solar concentrator device including a fan for providing a vortex gas circulation within an enclosure, and methods of operating the same, which are now described in further detail with accompanying figures. Throughout the drawings, the same reference numerals or letters are used to designate like or equivalent elements. The drawings are not necessarily drawn to scale.

Figure 1B:
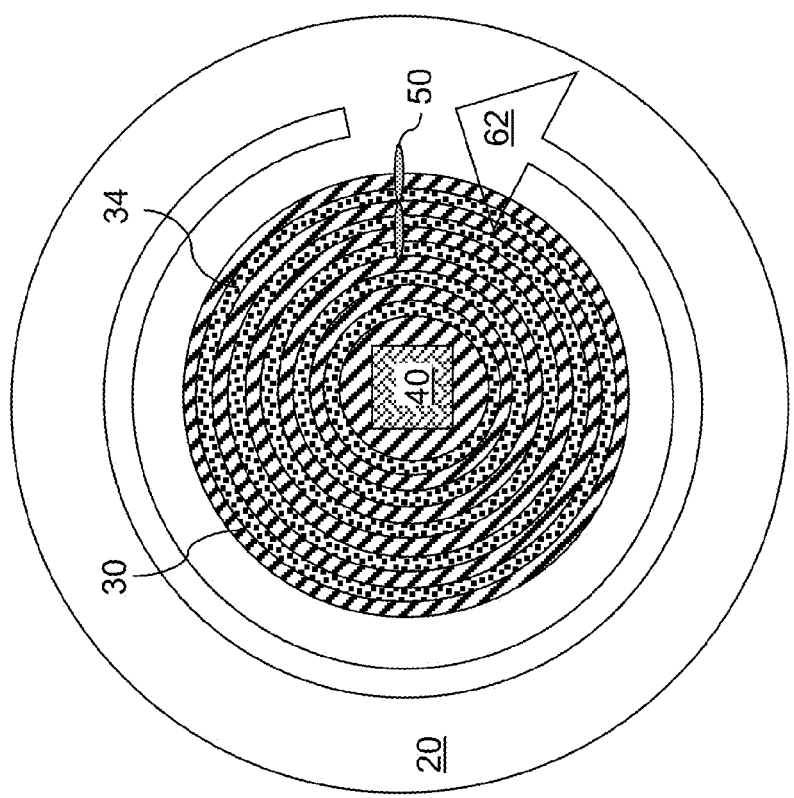
FIG. 1B is a top-down view of the first exemplary solar concentrator device of FIG. 1A according to an embodiment of the present disclosure.

Referring to FIGS. 1A and 1B, a first exemplary solar concentrator device according to an embodiment of the present disclosure includes an enclosure, at least one photovoltaic cell 40 located with the enclosure, and a fan 50 located within the enclosure. The enclosure includes at least one light-path altering component 10 located at a front side, a back panel 30 located at a back side, and a side panel 20 extending from the at least one light-path altering component 10 to the back panel.

As used herein, a "light-path altering component" can be any optical component that diffract, refract, or reflect light.

The at least one photovoltaic cell 40 is located on the back panel 30. The at least one photovoltaic cell 40 can be attached to the back panel 30 through a heat sink 32 that contacts the back panel 30 and through a mounting structure 42. The mounting structure 42 can be a layer of a conductive metallic paste, screws, bolts with accompanying threads formed within the heat sink 32 and/or the back panel 30, a clamp, or any other mechanical mounting structure known in the art.

The enclosure (10, 20, 30) provides structural support for components of the first exemplary solar concentrator device. The enclosure (10, 20, 30) can be an air-tight enclosure that isolates the ambient gas inside the enclosure (10, 20, 30) from the ambient gas outside the enclosure (10, 20, 30). The ambient gas inside the enclosure (10, 20, 30) can be kept free from dust, moisture, and other contaminants that are present in the ambient gas outside the enclosure (10, 20, 30), which can has the composition of atmosphere and includes dust and moisture. In one embodiment, the ambient gas within the enclosure (10, 20, 30) can be sealed off from the ambient gas outside of the enclosure (10, 20, 30), and be free of dust. In one embodiment, the ambient gas within the enclosure (10, 20, 30) can be sealed off from the ambient gas outside of the enclosure (10, 20, 30), and be free of dust and moisture.

Alternately, the enclosure (10, 20, 30) may not be air-tight, and may be configured to allow exchange between the ambient gas inside the enclosure (10, 20, 30) and the ambient gas outside the enclosure (10, 20, 30) through some flow of gases through holes or gaps present in the enclosure (10, 20, 30). The holes and/or gaps may be present within the at least one side panel 20, within the back panel 30 and/or within the heat sink 32, and/or at the joint between the at least one side panel 20 and at least one of the at least one light-path altering component 10 and the back panel 30.

In one embodiment, the at least one side panel 20 and the back panel 30 can include a metallic material. In one non-limiting embodiment, the metallic material can include at least one of copper, steel, aluminum, brass, tin, nickel, chrome, an alloy thereof, and a stack thereof.

In another embodiment, the at least one side panel 20 and the back panel 30 can include a thermally conductive plastic material. Thermally conductive plastic materials having a thermal conductivity in the range from conductivity in the range of 0.3 W/m K to 50 W/m K are known in the art.

A horizontal cross-sectional area of the enclosure (10, 20, 30) defined by an outer periphery of the at least one side panel 20 can be circular, elliptical, superelliptical, triangular, rectangular, pentagonal, hexagonal, polygonal with more than six sides, or can be any regular or irregular shape. The at least one side panel 20 can be a single side panel if the outer periphery of the at least one side panel 20 within the horizontal cross-sectional area does not include a point at which two lines meet at an angle, or can be a plurality of side panels if the outer periphery of the at least one side panel 20 within the horizontal cross-sectional area includes at least one point at which two lines meet at an angle.

In one embodiment, the horizontal cross-sectional area of the enclosure (10, 20, 30) can be a strictly increasing function of a vertical distance of a cross-sectional plane and the back panel 30. In this embodiment, the overall shape of the enclosure (10, 20, 30) can be a frustum having any type of shape for a horizontal cross-sectional area. For example, the overall shape of the enclosure (10, 20, 30) can be a circular frustum, an elliptical frustum, a superelliptical frustum, a triangular frustum, a rectangular frustum, a pentagonal frustum, a hexagonal frustum, a frustum with a polygonal horizontal cross-sectional shape having more than six sides, or can be a frustum with any regular or irregular cross-sectional shape.

In another embodiment, the horizontal cross-sectional area of the enclosure (10, 20, 30) can be the same irrespective of a vertical distance of a cross-sectional plane and the back panel 30. In this embodiment, the overall shape of the enclosure (10, 20, 30) can be a cylinder having any type of shape for a horizontal cross-sectional area. For example, the overall shape of the enclosure (10, 20, 30) can be a circular cylinder, an elliptical cylinder, a superelliptical cylinder, a triangular cylinder, a rectangular cylinder, a pentagonal cylinder, a hexagonal cylinder, a cylinder with a polygonal horizontal cross-sectional shape having more than six sides, or can be a cylinder with any regular or irregular cross-sectional shape.

The at least one light-path altering component 10 can include a single lens, a plurality of lenses that are laterally joined to each other or one another, a single minor, a plurality of minors that are laterally joined to each other or one another, or any type of optical component that is configured to alter the path of light that impinges on a surface thereof. Each lens in the at least one lens 10 can be a stand-alone lens that can focus light by itself, or a component of a combination lens that requires at least another lens or minor to focus light. Any type of lens that is configured to focus light at a focal point can be employed for the at least one lens 10. Each minor in the at least one lens 10 can be a stand-alone minor that can focus light by itself, or a component of a combination minor that requires at least another lens or mirror to focus light. Any type of minor that is configured to focus light, either alone or in combination with at least another minor or a minor, at a focal point can be employed for the at least one light-path altering component 10.

In one embodiment, the at least one light-path altering component 10 can be at least one Fresnel lens. In another embodiment, the at least one light-path altering component 10 can include at least one of a minor, a folding optics component, and a secondary optics as known in the art provided that the at least one light-path altering component 10 can be configured, either alone or in combination with at least another light-path altering component, to focus light at a distance from the at least one light-path altering component 10 in a direction opposite the source of the incident beam 11 such as the sun.

The at least one photovoltaic cell 40 is located at a focal point of the at least one light-path altering component 10. In one embodiment, each of the at least one photovoltaic cell 40 can be located at a focal point of one of the at least one light-path altering component 10. For example, if the at least one light-path altering component 10 includes at least one lens, one of the at least one photovoltaic cell 40 can be located at a focal point of one of the at least one lens. If the at least one light-path altering component 10 includes a composite lens system or an optical system including at least one minor and optionally at least one lens, one of the at least one photovoltaic cell 40 can be located at a focal point of the composite lens system or the optical system. In some embodiment, each of the at least one photovoltaic cell 40 can be located at a focal point of one of the at least one lens, a composite lens system, or an optical system including at least one minor and optionally at least one lens.

In one embodiment, the at least one light-path altering component 10 can be a Fresnel lens. The first exemplary solar concentrator device can be oriented so that the outside face of the Fresnel lens is perpendicular to the incident sunlight 11. The Fresnel lens alters the path of the incident sunlight 11 and focuses the refracted sunlight onto the at least one photovoltaic cell 40 located on the back panel 30 of the enclosure (10, 20, 30).

The at least one photovoltaic cell 40 is affixed to the heat sink 32 through the mounting structure 42. The at least one photovoltaic cell 40 can be any type of photovoltaic cells known in the art. In one embodiment, the at least one photovoltaic cell 40 can be at least one multijunction cell having different photovoltaic junctions optimized for absorbing photons in different wavelength ranges. The multiple photovoltaic junctions are located at different depths from the topmost surfaces of each of the at least one photovoltaic cells 40. In one embodiment, each area of the at least one photovoltaic cell 40 can be illuminated by roughly equal amounts of the solar rays in the multiple spectral regions.

A fraction of the energy contained in the incident sunlight 11 is converted to electricity in the at least one photovoltaic cell 40. The remainder of the energy in the incident sunlight 11 is conducted through the mounting structure 42 to the heat sink 32. In embodiments in which a heat sink is not employed, the remainder of the energy in the incident sunlight 11 is conducted through the mounting structure 42 directly to the back panel 30.

In embodiments in which a heat sink 32 is provided, the heat sink 32 is placed within the enclosure (10, 20, 30). The heat sink 32 contacts the inner surface of the back panel 30. The heat sink 32 includes a thermally conductive material, and can include a metallic material. In one embodiment, the heat sink 32 can include at least one of copper, steel, aluminum, brass, tin, nickel, chrome, an alloy thereof, and a stack thereof.

The heat sink 32 is configured to dissipate the heat generated from the energy focused onto the at least one photovoltaic cell 40 and not converted into electricity. The heat sink 32 is mechanically and thermally coupled to the back panel 32 employing any structures known in the art for permanently attaching two solid elements. Thus, the heat sink 32 is located between the back panel 32 and the at least one photovoltaic cell 40 and includes a surface exposed to an ambient gas within the enclosure (10, 20, 30).

Conductive fins 34 may, or may not, be provided on the heat sink 32. FIG. 2 illustrates a second exemplary solar concentrator device in which fins are not present on the heat sink 32.

In one embodiment, the heat sink 32 can include a planar thermally conductive plate. For example, the heat sink 32 can include a simple structure such as a planar sheet of a metallic material having a uniform thickness throughout. The thickness of such a planar sheet can be from 10 micron to 5 cm, although lesser and greater thicknesses can also be employed.

In another example, the heat sink 32 can include a vapor chamber. The vapor chamber is a device that employs evaporative cooling as an operational principle. A vapor chamber includes a transportation wick, a vaporization wick, and a condensation wick. A wick is a material that can draw in a liquid by capillary action. Liquid such as pure water is heated while in the transportation wick. After the liquid evaporates into a gas (such as water vapor) near the source of the heat, i.e., near the at least one photovoltaic cell 40, the gas moves into the condensation wick. Away from the heat source, i.e., near the back panel 30, the gas condenses back into a liquid (such as water). The liquid and travels back to the transportation wick by way of capillary action, and is ready for reuse in another cycle of heat transfer. The heat is conducted or radiated from the vapor chamber to the back panel 32 and to the ambient gas inside the enclosure (10, 20, 30).

In yet another example, the heat sink 32 can include a heat pipe. A heat pipe or a "heat pin" employs the same principle as the vapor chamber. The heat pipe makes a thermal contact with a heat source, i.e., the at least one photovoltaic cell 40 or the mounting structure 42, at a hot interface, and makes another thermal contact with a cold object, i.e., the back panel 30, at a cold interface. The inside of the heat pipe is at a reduced pressure. At the hot interface within the heat pipe, a coolant liquid in contact with a thermally conductive solid surface turns into a vapor by absorbing heat from that surface. The vapor condenses back into a liquid at the cold interface, releasing the latent heat. The liquid then returns to the hot interface through either capillary action or gravity action where it evaporates once more and repeats the cycle. In addition, the internal pressure of the heat pipe can be set or adjusted to facilitate the phase change depending on the demands of the working conditions of the thermally managed system. Exemplary coolants that can be employed for a heat pipe include ammonia (for operation between 213 K and 373 K), methanol (for operation between 283 K and 403 K), ethanol (for operation between 273 K and 403 K), water (for operation between 303K and 473 K), and combinations thereof. The heat is conducted or radiated from the heat pipe to the back panel 32 and to the ambient gas inside the enclosure (10, 20, 30).

Referring back to FIGS. 1A and 1B, fins 34 can be provided on the heat sink 32 to enhance heat loss to the ambient gas inside the enclosure (10, 20, 30). Specifically, the heat sink 32 can include conductive fins 34 or other structures that protrude inward from a planar inner surface (i.e., a surface of the heat sink 32 that does not contact the back panel 32 and contacts the ambient gas inside the enclosure (10, 20, 30)) of the heat sink 32.

For example, the heat sink 32 can include a combination of a planar sheet of a metallic material having a uniform thickness throughout and conductive fins 34 that protrude inward from the inner surface of the planar sheet. The conductive fins 34 can be blade-shaped or pin-shaped. The thickness of such a planar sheet can be from 10 micron to 5 cm, although lesser and greater thicknesses can also be employed. The width of each conductive fin can be from 10 micron to 5 mm, although lesser and greater widths can also be employed.

In another example, the heat sink 32 can include a finned vapor chamber. The finned vapor chamber can be derived from a vapor chamber as described above by attaching conductive fins 34 on an outer surface thereof. The conductive fins 34 can be blade-shaped or pin-shaped. The conductive fins 34 facilitate loss of heat at a cold end, i.e., at the condensation wick, of the finned vapor chamber. The heat is conducted or radiated from the vapor chamber to the back panel 32 and to the ambient gas inside the enclosure (10, 20, 30). Further, the heat is conducted or radiated from the conductive fins 34 to the ambient gas inside the enclosure (10, 20, 30).

In yet another example, the heat sink 32 can include a finned heat pipe. The finned heat pipe can be derived from the heat pipe described above by attaching conductive fins 34 on the outer surface thereof. The conductive fins 34 can be blade-shaped or pin-shaped. The conductive fins 34 facilitate loss of heat at a cold interface of the finned heat pipe. The heat is conducted or radiated from the heat pipe to the back panel 32 and to the ambient gas inside the enclosure (10, 20, 30). Further, the heat is conducted or radiated from the conductive fins 34 to the ambient gas inside the enclosure (10, 20, 30).

Figure 3:
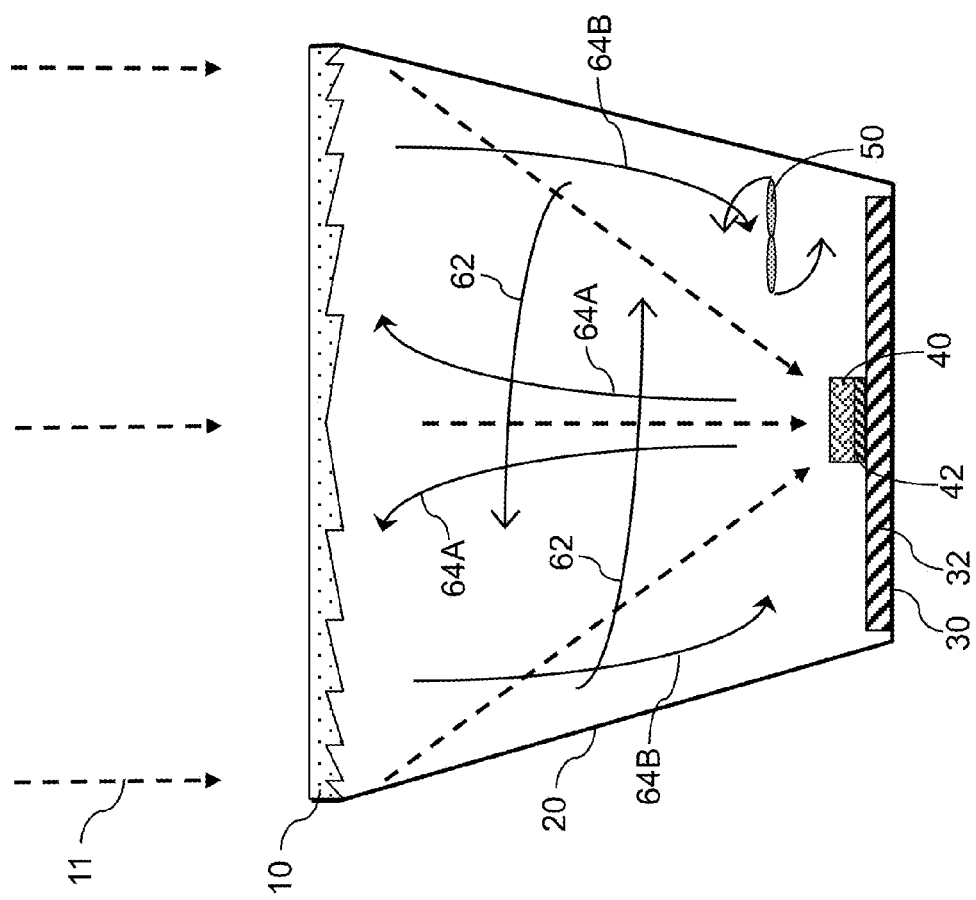
FIG. 3 is a top down view of a third exemplary solar concentrator device according to an embodiment of the present disclosure.
Figure 4:
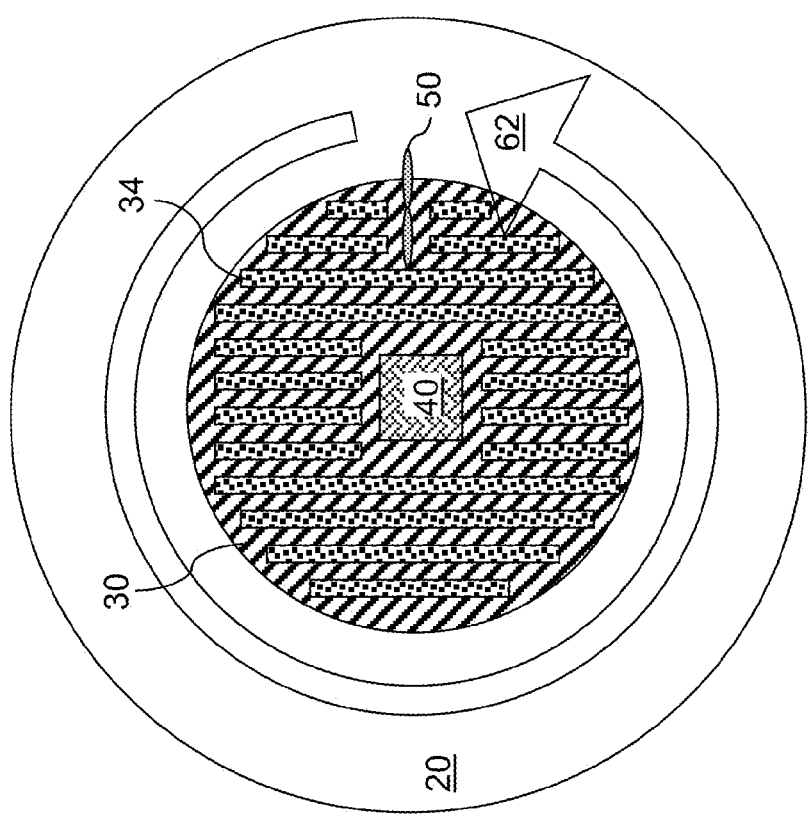
FIG. 4 is a top-down view of a fourth exemplary solar concentrator device according to an embodiment of the present disclosure.

The fins 34 can have various shapes. The fins 34 can be blade-shaped as in the third exemplary solar concentrator device illustrated in FIG. 3 and in the fourth exemplary solar concentrator device illustrated in FIG. 4. The fins 34 can be arranged in various patterns such as a liner pattern having a regular spacing as in the third exemplary solar concentrator device illustrated in FIG. 3, a spiral pattern as in the fourth exemplary solar concentrator device illustrated in FIG. 4, or any other pattern for arranging cooling fins as known in the art.

Figure 5:
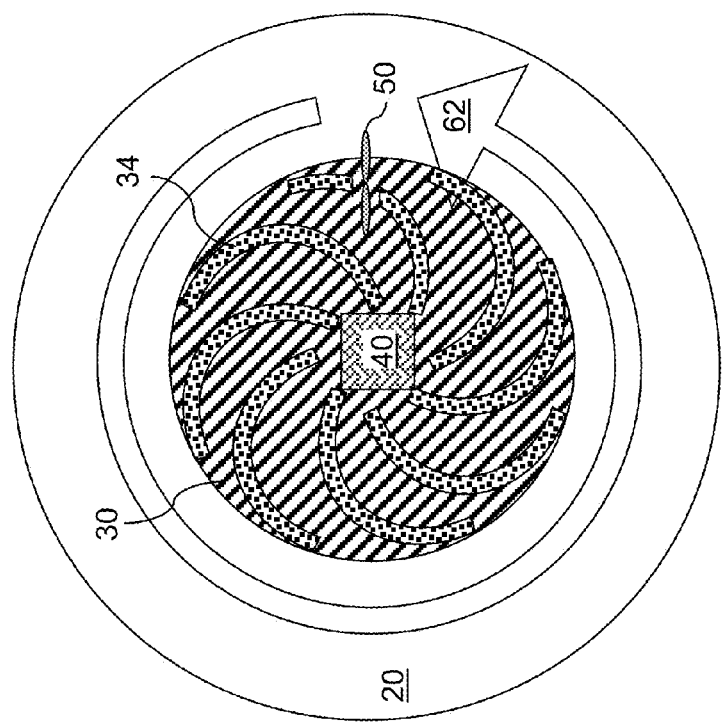
FIG. 5 is a top-down view of a fifth exemplary solar concentrator device according to an embodiment of the present disclosure.

Alternately or additionally, the fins 34 can be pin-shaped as in the fifth exemplary solar concentrator device illustrated in FIG. 5. The pin-shaped fins can be arranged in any pattern known in the art for arranging pin-shaped fins for the purpose of cooling.

Figure 6:
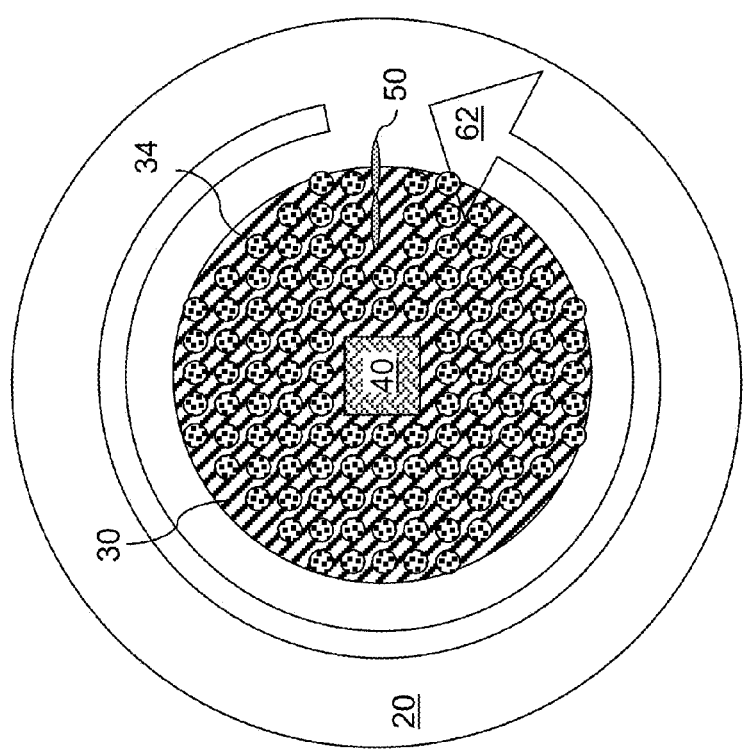
FIG. 6 is a vertical cross-sectional view of a sixth exemplary solar concentrator device according to an embodiment of the present disclosure.

In one embodiment, the heat sink 32 and the back panel 30 can be merged into a single mechanical component that performs the dual functions of sealing the inside of the enclosure (10, 20, 30) and extracting excess heat from the at least one photovoltaic cell 40. In such cases, conductive fins 34 can be provided directly on the merged mechanical component (30, 32). FIG. 6 illustrates a sixth exemplary solar concentrator device in which a separate heat sink is not provided, and the back panel 30 performs the function of a heat sink in the first exemplary solar concentrator device.

Figure 7:
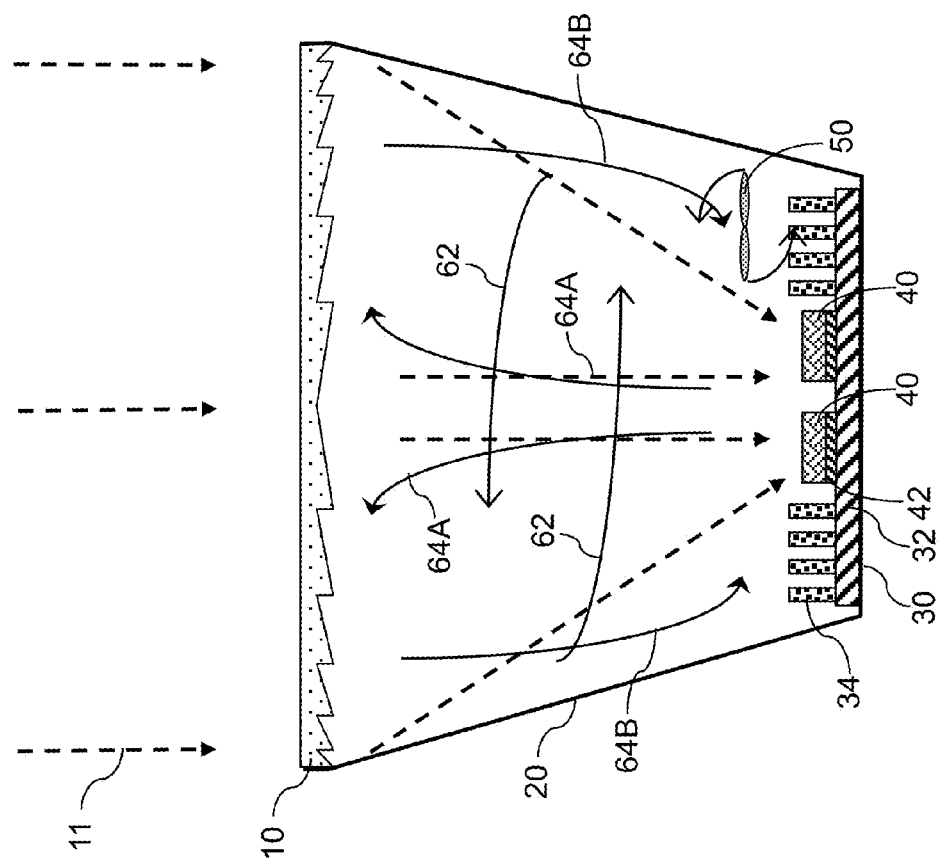
FIG. 7 is a vertical cross-sectional view of a seventh exemplary solar concentrator device according to an embodiment of the present disclosure.
Figure 8:
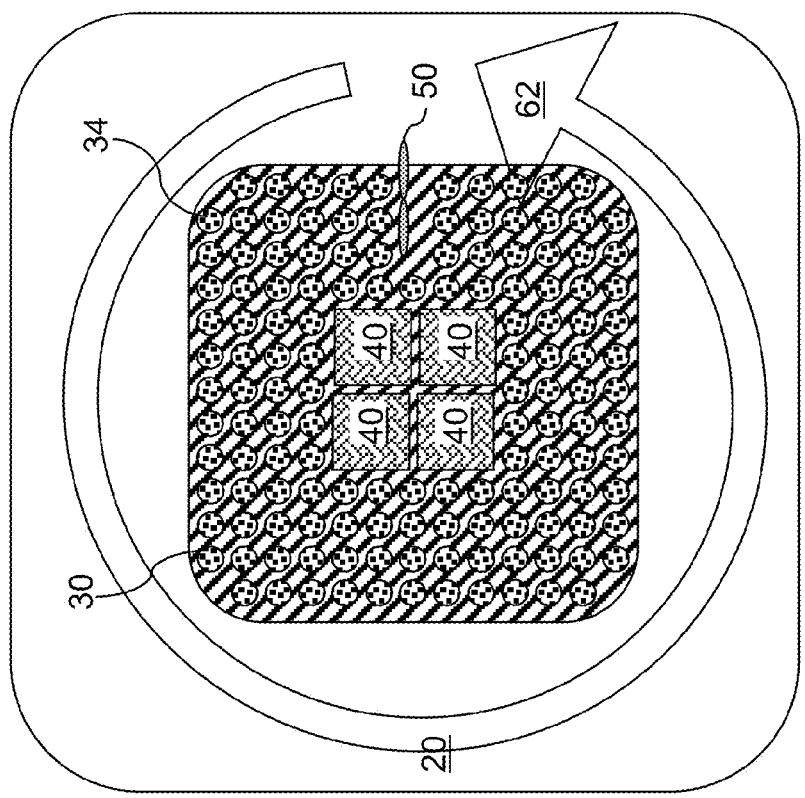
FIG. 8 is a top-down view of the seventh exemplary solar concentrator device of FIG. 1A according to an embodiment of the present disclosure.

Referring to FIGS. 7 and 8, the at least one light-path altering component 10 can be a plurality of light-path altering components. For example, the at least one light-path altering component 10 can be a plurality of Fresnel lenses.

Alternately or additionally, the at least one photovoltaic cell 40 can be a plurality of photovoltaic cells. In such cases, the at least one light-path altering component 10 can be configured to focus incident sunlight 11 to each of the plurality of photovoltaic cells.

In one embodiment, the at least one light-path altering component 10 can be a plurality of Fresnel lenses that focuses incident sunlight 11 on a plurality of photovoltaic cells.

A fraction of the energy contained in the incident sunlight 11 is converted to electricity in the at least one photovoltaic cell 40. The remainder of the energy in the incident sunlight 11 is conducted through the mounting structure 42 to the heat sink 32. In embodiments in which a heat sink is not employed, the remainder of the energy in the incident sunlight 11 is conducted through the mounting structure 42 directly to the back panel 30.

Because the top surface(s) of the at least one photovoltaic cell 40 is/are the hottest surface(s) within the enclosure (10, 20, 30), a toroidal gas circulation pattern is present within the enclosure (10, 20, 30) in the absence of the fan 50 or while the fan 50 is not operational. Specifically, the hot surface(s) of the at least one photovoltaic cell 40 heats up the ambient gas within the enclosure (10, 20, 30) that is in direct contact the hot surface(s) of the at least one photovoltaic cell 40. The density of the heated portion of the ambient gas decreases and the heated portion of the ambient gas rises toward the at least one light-path altering component 10 in an updraft 64A. As the ambient gas carried by the updraft 64A is cooled at the inner surface(s) of the at least one light-path altering component, the density of the cooled ambient gas increases, and the cooled ambient gas flows down along the inner sidewalls of the at least one side panel 32 in a downdraft 64B. The updraft 64A and the downdraft 64B collectively constitute a toroidal gas circulation pattern within the enclosure (10, 20, 30).

The fan 50 includes a motor and at least one blade oriented at a non-orthogonal angle with respect to the axis of rotation of the at least one blade. The at least one blade can be a plurality of blades having an n-fold rotational symmetry, in which n is an integer greater than 1. The surface(s) of the at least one blade can be curved to enhance the efficiency of the fan 50 in generating a flow of the ambient gas within the enclosure (10, 20, 30).

The fan 50 is affixed within the enclosure (10, 20, 30) and is positioned and oriented in a direction that introduces an azimuthal component to the gas circulation pattern within the enclosure (10, 20, 30). The azimuthal component to the gas circulation pattern can be clockwise or counterclockwise. FIGS. 1A and 1B illustrate an example of a counterclockwise azimuthal component 62 of the gas circulation pattern within the enclosure (10, 20, 30).

It is noted that the azimuthal component of the gas circulation pattern is absent within the enclosure (10, 20, 30) if the fan 50 is not operational. The fan 50 introduces the azimuthal component of the gas circulation pattern by providing a clockwise flow component or a counterclockwise component to the gas circulation pattern within the enclosure (10, 20, 30). When the azimuthal component, or a "circumferential component," of the gas circulation pattern is combined with the pre-existing toroidal gas circulation pattern, a vortex gas circulation pattern is established within the enclosure (10, 20, 30).

The rotational axis of the fan 50 is oriented in a direction that generates a vortex gas circulation within the enclosure (10, 20, 30) during operation of the fan 50. The fan 50 can be placed at a position that does not overlie the at least one photovoltaic cell 40.

In one embodiment, the fan 50 can be placed within the enclosure (10, 20, 30) and positioned and oriented approximately parallel to a proximal side surface of the enclosure (10, 20, 30), i.e., the portion of the inner surface of the at least one side panel 20 that is most proximal to the fan 50, so as to provide the vortex gas circulation within the enclosure (10, 20, 30).

In one embodiment, the rotational axis of the fan 50 is not parallel to any optical axis of the at least one light-path altering component 10. If the at least one light-path altering component includes at least one lens, the rotational axis of the fan 50 is not parallel to any optical axis of the at least one lens.

In one embodiment, the rotational axis of the fan 50 does not pass through any optical axis of the at least one light-path altering component. If the at least one light-path altering component includes at least one lens, the rotational axis of the fan 50 does not pass through any optical axis of the at least one lens.

In one embodiment, the rotational axis of the fan is perpendicular to an optical axis of the at least one light-path altering component. If the at least one light-path altering component includes at least one lens, the rotational axis of the fan 50 is perpendicular to an optical axis of the at least one lens.

In one embodiment, the rotational axis of the fan 50 can be oriented in a direction that is parallel to a tangent plane to a portion of the at least one side panel 20 that is most proximate to the fan 50.

In an exemplary illustration, a fan 50 requiring only 1 to 3 W of power for operation can be employed for an application requiring the removal of 100 W/cm$^2$ of waste heat. This level of power requirement corresponds to about 2 percent of the electric power produced by a corresponding photovoltaic cell.

Further, because the ambient gas within the enclosure (10, 20, 30) can be sealed to avoid contamination by humidity or dust, the fan 50 can operate in a completely contamination free environment. Under such operating conditions, a very long operational lifetime, typically greater than 5,000 hours, can be expected.

Within the vortex gas circulation pattern, the azimuthal gas flow pattern is a primary flow component, and the toroidal gas flow pattern is a secondary flow component. A vector field can be defined by a set of velocity vectors representing the velocity of the gas flow at each point occupied by the ambient gas within the enclosure (10, 20, 30). The average magnitude of the horizontal component of the velocity vectors is greater than the average magnitude of the vertical component of the velocity vectors within the vector field.

A hypothetical particle starting at the fan 50 would follow a three-dimensional spiral path around a vertical axis passing through a geometrical center of the at least one photovoltaic cell 40 to the top of the enclosure (10, 20, 30), i.e., the bottom surface of the at least one light-path altering component 10. Subsequently, the hypothetical particle would spiral down along another three-dimensional spiral path in proximity to the sides of the enclosure (10, 20, 30) and around the vertical axis. The hypothetical particle would then move inward at a lower portion of the volume in the enclosure (10, 20, 30) above the heat sink 32 and any conductive fins 34 thereupon toward the at least one photovoltaic cell 40. The rotational direction of the hypothetical particle as observed in a top-down view remains the same. If the hypothetical particle starts in a counterclockwise direction, the rotational direction of the hypothetical particle remains counterclockwise throughout the entire trajectory, and vice versa.

Heat is transferred from the at least one photovoltaic cell 40 and the heat sink 32 and the fins 34, if present, to a portion of the ambient gas that comes to contact with the surfaces of the at least one photovoltaic cell 40 and the heat sink 32 and the fins 34 so that that portion of the ambient gas becomes hot.

The hot portion of the ambient gas travels in the vortex gas circulation pattern and contacts the inner (downward) surfaces of the at least one light-path altering component 10 and the inner surfaces of the at least one side panel 20. Heat is transferred from the hot portion of the ambient gas to the at least one light-path altering component 10 and the at least one side panel 20. The at least one light-path altering component 10 and the at least one side panel 20 loses heat to the environment surrounding a solar concentrator device, which can be, for example, any of the exemplary solar concentrator devices illustrated in the drawings. For example, the heat may be dissipated to air surrounding the solar concentrator device.

In general, the vortex gas circulation can be generated within the enclosure (10, 20, 30) by running the fan 50 while the at least one photovoltaic cell 40 generates electricity. The fan 50 can be configured to be powered by a fraction of the electricity that the at least one photovoltaic cell 40. In such cases, the fan 50 can operate only while the at least one photovoltaic cell 40 generates electricity.

The vortex gas circulation conveys the ambient gas inside the enclosure (10, 20, 30) and the heat that the ambient gas carries to the entirety of the at least one light-path altering component 10 and the at least one side panel 20. Thus, the entire surface area of the enclosure (10, 20, 30) can be employed to lose the excess heat generated at the at least one photovoltaic cell 40. In other words, the enclosure (10, 20, 30) itself is used as the primary thermal interface to the environment surrounding the solar concentrator device.

The cooling method of an embodiment of the present disclosure also allows the area of the heat sink 32 of the solar concentrator device of the present disclosure to be smaller than the area of a heat sink in a prior art solar concentrator device generating a comparable amount of excess heat because the entire outer surfaces of the solar concentrator device of the present disclosure function as cooling surfaces. In practice, the total surface area of the solar concentrator device of embodiments of the present disclosure is at least four time the total surface area that is used to radiate heat in prior art solar concentrator devices, which use only surfaces of a heat sink located outside an enclosure to radiate heat.

In the cooling methods of an embodiment of the present disclosure, forced air cooling is employed to cool at least one photovoltaic cell 40 located within a solar concentrator device. A heat sink 32 may, or may not, be provided in the solar concentrator device. If present, the heat sink 32 may be placed inside the enclosure (10, 20, 30) of the solar concentrator device. A fan 50 is used to drive an internal airflow and to form a vortex gas circulation pattern within the enclosure (10, 20, 30).

During operation of the solar concentration device, heat is generated by the portion of the solar energy that is not converted into electricity at the at least one photovoltaic cell 40 within the enclosure (10, 20, 30) of the solar concentration device. The heat is dissipated by conduction from the at least one photovoltaic cell 40 to the heat sink 32 and any conductive fins 34 attached thereto. The ambient gas within the enclosure (10, 20, 30) that passes over the heat sink 32 absorbs the heat in the heat sink 32 and the conductive fins 34, if present, that are attached to the heat sink 32. The vortex gas circulation pattern causes the heated gas to flow over the entirety of the inner surfaces of the at least one side panel 20 of the enclosure (10, 20, 30) and underneath the inner surfaces of at least one light-path altering component 10 employed to focus the solar radiation onto the at least one photovoltaic cell 40 before returning to the surface of the heat sink 32.

The heat transferred to the at least one side panel 20 and the at least one light-path altering component 10 is dissipated by conduction to ambient air outside the enclosure (10, 20, 30), convection through the ambient air, or radiation from the outer surfaces of the at least one side panel 20 and the at least one light-path altering component 10. Because all surfaces of the enclosure (10, 20, 30) constituting the outer boundaries of the solar concentrator device dissipates heat in various modes including conduction, convection, and radiation, the solar concentrator device can effectively dissipate the heat more effectively than conventional solar concentrators that do not employ a fan or an internal vortex gas circulation pattern.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A solar concentrator device comprising:
an enclosure containing an enclosed volume of an enclosed ambient gas therein and defined by at least one focusing component located at a front side, a back panel located at a back side, and at least one side panel extending from said at least one focusing component to said back panel, said enclosed ambient gas sealed off from any ambient outside said enclosure;
at least one photovoltaic cell located within said enclosure and on said back panel; wherein a vertical axis of said enclosure passes through a geometrical center of said at least one photovoltaic cell within said enclosure and is perpendicular to a surface of said back panel
a fan located within said enclosure and configured to provide circulation of said enclosed volume of said enclosed ambient gas confined entirely within said enclosure, said fan is affixed within said enclosure at a position that is offset from said vertical axis and is oriented such that a rotational axis of said fan is not parallel to said vertical axis and said fan generates an azimuthal component around said vertical axis within a circulation pattern of said enclosed gas ambient, wherein said azimuthal component combines with a toroidal gas circulation pattern including an updraft and a downdraft due to a temperature differential between surfaces of said at least one photovoltaic cell and said at least one focusing component during operation of said solar concentrator device, and generates a combined circulation pattern in which said enclosed ambient gas travels in a three-dimensional spiral path around said vertical axis of said enclosure with a same rotational direction throughout said three-dimensional spiral path; and
a heat sink located within said enclosure and in contact with said enclosed ambient gas within said enclosure and including a planar surface to which said at least one photovoltaic cell is mounted through a mounting structure and further including conductive fins that protrude inward from said planar surface and contact said enclosed ambient gas inside said enclosure and radiate, or conduct, heat from said conductive fins to said enclosed ambient gas, said enclosed ambient gas in said three-dimensional spiral path impinging on surfaces of said conductive fins with said azimuthal component.

2. The solar concentrator device of claim 1, wherein a rotational axis of said fan is not parallel to any optical axis of said at least one focusing component.

3. The solar concentrator device of claim 1, wherein a rotational axis of said fan does not pass through any optical axis of said at least one focusing component.

4. The solar concentrator device of claim 1, wherein a rotational axis of said fan is perpendicular to an optical axis of said at least one focusing component.

5. The solar concentrator device of claim 1, wherein a rotational axis of said fan is oriented in a direction that generates a vortex gas circulation within said enclosure during operation of said fan.

6. The solar concentrator device of claim 1, wherein a rotational axis of said fan is oriented in a direction that is parallel to a tangent plane to a portion of said at least one side panel that is most proximate to said fan.

7. The solar concentrator device of claim 1, wherein said heat sink is located between said back panel and said at least one photovoltaic cell.

8. The solar concentrator device of claim 1, wherein said heat sink includes at least one of a planar thermally conductive plate, a finned thermally conductive plate, a vapor chamber, a finned vapor chamber, a heat pipe, and a finned heat pipe.

9. The solar concentrator device of claim 1, wherein said heat sink includes at least one of a finned thermally conductive plate, a finned vapor chamber, and a finned heat pipe, and includes conductive fins that are blade-shaped or pin-shaped.

10. The solar concentrator device of claim 1, wherein said at least one side panel and said back panel comprise a metallic material.

11. The solar concentrator device of claim 10, wherein said at least one side panel and said back panel comprise at least one of copper, steel, aluminum, brass, tin, nickel, chrome, an alloy thereof, a stack thereof, and a plastic material.

12. The solar concentrator device of claim 1, wherein one of said at least one photovoltaic cell is located at a focal point of one of said at least one focusing component.

13. The solar concentrator device of claim 1, wherein said at least one focusing component is at least one Fresnel light-path altering component.

14. A method of operating a solar concentrator device comprising:
providing a solar concentrator device comprising:
an enclosure containing an enclosed volume of an enclosed ambient gas therein and defined by at least one focusing component located at a front side, a back panel located at a back side, and at least one side panel extending from said at least one focusing component to said back panel, said enclosed ambient gas sealed off from any ambient outside said enclosure;
at least one photovoltaic cell located within said enclosure and on said back panel; wherein a vertical axis of said enclosure passes through a geometrical center of said at least one photovoltaic cell within said enclosure and is perpendicular to a surface of said back panel
a fan located within said enclosure and configured to provide circulation of said enclosed volume of said enclosed ambient gas confined entirely within said enclosure, said fan is affixed within said enclosure at a position that is offset from said vertical axis and is oriented such that a rotational axis of said fan is not parallel to said vertical axis and said fan generates an azimuthal component around said vertical axis within a circulation pattern of said enclosed gas ambient, wherein said azimuthal component combines with a toroidal gas circulation pattern including an updraft and a downdraft due to a temperature differential between surfaces of said at least one photovoltaic cell and said at least one focusing component during operation of said solar concentrator device, and generates a combined circulation pattern in which said enclosed ambient gas travels in a three-dimensional spiral path around said vertical axis of said enclosure with a same rotational direction throughout said three-dimensional spiral path; and
a heat sink located within said enclosure and in contact with said enclosed ambient gas within said enclosure and including a planar surface to which said at least one photovoltaic cell is mounted through a mounting structure and further including conductive fins that protrude inward from said planar surface and contact said enclosed ambient gas inside said enclosure and radiate, or conduct, heat from said conductive fins to said enclosed ambient gas, said enclosed ambient gas in said three-dimensional spiral path impinging on surfaces of said conductive fins with said azimuthal component; and
generating a vortex gas circulation within said enclosed volume of said enclosed ambient gas within said enclosure by running said fan while said at least one photovoltaic cell generates electricity.

15. The method of claim 14, wherein a rotational axis of said fan is not parallel to any optical axis of said at least one focusing component.

16. The method of claim 14, wherein a rotational axis of said fan does not pass through any optical axis of said at least one focusing component.

17. The method of claim 14, wherein a rotational axis of said fan is perpendicular to an optical axis of said at least one focusing component.

18. The method of claim 14, wherein said heat sink is located between said back panel and said at least one photovoltaic cell.

19. The method of claim 14, wherein said heat sink includes at least one of a planar thermally conductive plate, a finned thermally conductive plate, a vapor chamber, a finned vapor chamber, a heat pipe, and a finned heat pipe.

20. The method of claim 14, wherein said heat sink includes at least one of a finned thermally conductive plate, a finned vapor chamber, and a finned heat pipe, and includes conductive fins that are blade-shaped or pin-shaped.

21. The method of claim 18, wherein one of said at least one photovoltaic cell is located at a focal point of one of said at least one focusing component.

22. The solar concentrator device of claim 1, wherein said enclosure seals off said enclosed volume and separates said enclosed ambient gas from another ambient gas outside said enclosure.

23. The method of claim 14, wherein said enclosure seals off said enclosed volume and separates said enclosed ambient gas from another ambient gas outside said enclosure.

* * * * *